United States Patent
Dayringer et al.

(10) Patent No.: US 9,082,632 B2
(45) Date of Patent: Jul. 14, 2015

(54) RAMP-STACK CHIP PACKAGE WITH VARIABLE CHIP SPACING

(75) Inventors: Michael H. S. Dayringer, Union City, CA (US); Nyles I. Nettleton, Cupertino, CA (US); Robert David Hopkins, II, Foster City, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 387 days.

(21) Appl. No.: 13/468,891

(22) Filed: May 10, 2012

(65) Prior Publication Data

US 2013/0299977 A1 Nov. 14, 2013

(51) Int. Cl.
*H01L 23/48* (2006.01)
*H01L 23/52* (2006.01)
(Continued)

(52) U.S. Cl.
CPC ............ *H01L 25/0652* (2013.01); *H01L 24/14* (2013.01); *H01L 24/81* (2013.01); *H01L 25/0657* (2013.01); *H01L 24/05* (2013.01); *H01L 24/16* (2013.01); *H01L 24/17* (2013.01); *H01L 24/32* (2013.01); *H01L 24/73* (2013.01); *H01L 25/18* (2013.01); *H01L 2224/0401* (2013.01); *H01L 2224/0557* (2013.01); *H01L 2224/1403* (2013.01); *H01L 2224/16145* (2013.01); *H01L 2224/16225* (2013.01);
(Continued)

(58) Field of Classification Search
USPC ................................................ 257/738, 777
See application file for complete search history.

(56) References Cited

U.S. PATENT DOCUMENTS

| 4,500,905 A | 2/1985 | Shibata |
| 4,879,588 A | 11/1989 | Ohtsuka et al. |

(Continued)

FOREIGN PATENT DOCUMENTS

| DE | 10034081 A1 | 10/2001 |
| EP | 1028463 | 8/2000 |

(Continued)

OTHER PUBLICATIONS

O'Reilly, Mike et al. "Jetting Your Way to Fine-Pitch 3D Interconnects", Chip Scale Review, Sep./Oct. 2010, pp. 18-21, chipscalereview.com.

(Continued)

*Primary Examiner* — Khiem D Nguyen
*Assistant Examiner* — Wilner Jean Baptiste
(74) *Attorney, Agent, or Firm* — Park, Vaughan, Fleming & Dowler LLP; Steven E. Stupp

(57) ABSTRACT

A chip package includes a stack of semiconductor dies or chips that are offset from each other, thereby defining a terrace with exposed pads. Moreover, surfaces of each of the semiconductor dies in the stepped terrace include two rows of first pads approximately parallel to edges of the semiconductor dies. Furthermore, the chip package includes a high-bandwidth ramp component, which is positioned approximately parallel to the terrace, and which has a surface that includes second pads arranged in at least two rows of second pads for each of the semiconductor dies. The second pads are electrically and mechanically coupled to the exposed first pads by connectors. Consequently, the electrical contacts in the chip package may have a conductive, a capacitive or, in general, a complex impedance. Furthermore, the chips and/or the ramp component may be positioned relative to each other using a ball-and-pit alignment technique.

19 Claims, 12 Drawing Sheets

(51) Int. Cl.
*H01L 29/40* (2006.01)
*H01L 25/065* (2006.01)
*H01L 25/18* (2006.01)
*H01L 23/00* (2006.01)

(52) U.S. Cl.
CPC ........... *H01L 2224/17181* (2013.01); *H01L 2224/32145* (2013.01); *H01L 2224/73203* (2013.01); *H01L 2224/73253* (2013.01); *H01L 2224/81123* (2013.01); *H01L 2224/81129* (2013.01); *H01L 2225/06517* (2013.01); *H01L 2225/06562* (2013.01); *H01L 2225/06568* (2013.01); *H01L 2225/06579* (2013.01); *H01L 2924/00014* (2013.01)

(56) References Cited

U.S. PATENT DOCUMENTS

| | | | |
|---|---|---|---|
| 5,495,398 | A | 2/1996 | Takiar et al. |
| 5,652,811 | A | 7/1997 | Cook et al. |
| 5,703,436 | A | 12/1997 | Forrest et al. |
| 5,998,864 | A | 12/1999 | Khandros et al. |
| 6,215,182 | B1 | 4/2001 | Ozawa et al. |
| 6,376,904 | B1 * | 4/2002 | Haba et al. ............ 257/686 |
| 6,396,967 | B1 | 5/2002 | Suzuki et al. |
| 6,621,155 | B1 | 9/2003 | Perino et al. |
| 6,812,569 | B2 | 11/2004 | Iwatsu et al. |
| 6,858,938 | B2 | 2/2005 | Michii |
| 6,905,911 | B2 | 6/2005 | Hamaguchi et al. |
| 6,921,867 | B2 | 7/2005 | Christensen |
| 7,015,586 | B2 | 3/2006 | Chien |
| 7,211,885 | B2 | 5/2007 | Nordal et al. |
| 7,262,506 | B2 | 8/2007 | Mess et al. |
| 7,348,668 | B2 | 3/2008 | Masuda et al. |
| 7,375,419 | B2 | 5/2008 | Mess et al. |
| 7,420,269 | B2 | 9/2008 | Ha et al. |
| 7,420,281 | B2 | 9/2008 | Tsunozaki |
| 7,495,326 | B2 | 2/2009 | Rinne |
| 7,547,961 | B2 | 6/2009 | Nishizawa et al. |
| 7,566,585 | B2 | 7/2009 | Theuss |
| 7,573,720 | B1 | 8/2009 | Drost et al. |
| 7,582,953 | B2 | 9/2009 | Lin |
| 7,582,963 | B2 | 9/2009 | Gerber et al. |
| 7,592,691 | B2 | 9/2009 | Corisis et al. |
| 7,615,853 | B2 | 11/2009 | Shen et al. |
| 7,633,146 | B2 | 12/2009 | Masuda et al. |
| 7,663,246 | B2 | 2/2010 | Chen et al. |
| 7,687,400 | B2 | 3/2010 | Trezza |
| 7,704,794 | B2 | 4/2010 | Mess et al. |
| 7,732,908 | B2 | 6/2010 | Nishiyama et al. |
| 7,755,175 | B2 | 7/2010 | Ishida et al. |
| 7,786,595 | B2 | 8/2010 | Shen et al. |
| 7,816,771 | B2 | 10/2010 | Shen et al. |
| 7,832,818 | B1 | 11/2010 | McElfresh |
| 7,855,446 | B2 | 12/2010 | Nishiyama et al. |
| 7,879,647 | B2 | 2/2011 | Masuda et al. |
| 7,911,045 | B2 | 3/2011 | Matsushima et al. |
| 7,952,183 | B2 | 5/2011 | Okada et al. |
| 7,998,792 | B2 | 8/2011 | Mess et al. |
| 7,999,378 | B2 | 8/2011 | Mess et al. |
| 8,049,342 | B2 | 11/2011 | Mess et al. |
| 8,064,739 | B2 | 11/2011 | Binkert et al. |
| 2004/0155322 | A1 | 8/2004 | Cho et al. |
| 2004/0164391 | A1 | 8/2004 | Okamura |
| 2004/0164392 | A1 | 8/2004 | Lee |
| 2006/0290377 | A1 | 12/2006 | Kim et al. |
| 2007/0170572 | A1 | 7/2007 | Liu et al. |
| 2007/0170573 | A1 | 7/2007 | Kuroda et al. |
| 2007/0262437 | A1 | 11/2007 | Hosokawa et al. |
| 2008/0083977 | A1 | 4/2008 | Haba et al. |
| 2008/0136005 | A1 | 6/2008 | Lee et al. |
| 2008/0174030 | A1 | 7/2008 | Liu et al. |
| 2008/0176358 | A1 | 7/2008 | Liu et al. |
| 2008/0303131 | A1 | 12/2008 | McElrea et al. |
| 2009/0085222 | A1 | 4/2009 | Yamano |
| 2009/0085223 | A1 | 4/2009 | Nishiyama et al. |
| 2009/0134528 | A1 | 5/2009 | Lee et al. |
| 2009/0166839 | A1 | 7/2009 | Suzuki et al. |
| 2009/0230528 | A1 | 9/2009 | McElrea et al. |
| 2009/0321954 | A1 | 12/2009 | Oh |
| 2010/0193930 | A1 | 8/2010 | Lee |
| 2011/0018120 | A1 | 1/2011 | Drost et al. |
| 2011/0062596 | A1 | 3/2011 | Murayama et al. |
| 2011/0074047 | A1 * | 3/2011 | Pendse ............ 257/782 |
| 2011/0200976 | A1 | 8/2011 | Hou et al. |
| 2012/0043671 | A1 | 2/2012 | Nishiyama et al. |
| 2012/0051695 | A1 | 3/2012 | Harada et al. |
| 2012/0056327 | A1 * | 3/2012 | Harada et al. ............ 257/773 |

FOREIGN PATENT DOCUMENTS

| | | |
|---|---|---|
| EP | 2001036309 | 9/2001 |
| JP | H06291248 A | 10/1994 |
| JP | 200136309 | 9/2001 |
| WO | 9940627 | 8/1999 |

OTHER PUBLICATIONS

Smith, Donald L et al. Flip-Chip Bonding on 6-um Pitch using Thin-Film Microspring Technology, Published in Proc., 48th Electronic Components and Technology Conf: Seattle, Washington, May 1998.

Saito, Mitsuko et al. A 2Gb/s 1.8pJ/b/chip Inductive-Coupling Through-Chip Bus for 128-Die NAND-Flash Memory Stacking:, ISSCC 2010/Session 24/Dram & Flash Memories/24.5, 2010, pp. 440-442.

Kang, Uksong et al. "8 Gb-3D DDR3 DRAM Using Through-Silicon-Via Technology", IEEE Journal of Solid-State Circuits, vol. 45, No. 1, Jan. 2010, pp. 111-119.

Schuylenbergh, Koenraad Van et al. "On-Chip Out-of-Plane High-Q Inductors", IEEE 2002, pp. 364-373.

* cited by examiner

RAMP-STACK CHIP PACKAGE WITH VARIABLE CHIP SPACING

CROSS REFERENCE TO RELATED APPLICATIONS

This application is related to U.S. patent application Ser. No. 12/507,349, entitled "High-Bandwidth Ramp-Stack Chip Package," by Robert J. Drost et al., which was filed on Jul. 22, 2009, the contents of which are herein incorporated by reference.

BACKGROUND

1. Field

The present disclosure generally relates to a semiconductor chip package. More specifically, the present disclosure relates to a chip package that includes a group of chips arranged in a stack, and a ramp component, which is oriented at an angle relative to the stack, and which is coupled to the chips.

2. Related Art

Chip packages that include stacked semiconductor chips can provide higher performance and lower cost in comparison to conventional individually packaged chips that are connected to a printed circuit board. These chip packages also provide certain advantages, such as the ability: to use different processes on different chips in the stack, to combine higher density logic and memory, and to transfer data using less power. For example, a stack of chips that implements a dynamic random access memory (DRAM) can use a high-metal-layer-count, high-performance logic process in a base chip to implement input/output (I/O) and controller functions, and a set of lower metal-layer-count, DRAM-specialized processed chips can be used for the rest of the stack. In this way the combined set of chips may have better performance and lower cost than: a single chip that includes I/O and controller functions manufactured using the DRAM process; a single chip that includes memory circuits manufactured using a logic process; and/or using a single process to make both logic and memory physical structures.

Existing techniques for stacking chips include wire bonding and through-silicon vias (TSVs). Wire bonding is a low-bandwidth, low-cost technique in which chips are stacked offset from one another to define a staircase of chip edges that includes exposed bond pads. Electrical connections to the chips are implemented by bonding wires to these bond pads.

In contrast, TSVs typically have a higher bandwidth than wire bonds. In a TSV fabrication technique, chips are processed so that one or more of their metal layers on their active face is conductively connected to new pads on their back face. Then, chips are adhesively connected in a stack, so that the new pads on the back face of one chip make conductive contact with corresponding pads on the active face of an adjacent chip.

However, TSVs typically have a higher cost than wire bonds. This is because TSVs pass through the active silicon layer of a chip. As a consequence, a TSV occupies area that could have been used for transistors or wiring. This opportunity cost can be large. For example, if the TSV exclusion or keep-out diameter is 20 µm, and TSVs are placed on a 30-µm pitch, then approximately 45% of the silicon area is consumed by the TSVs. This roughly doubles the cost per area for any circuits in the chips in the stack. (In fact, the overhead is likely to be even larger because circuits are typically spread out to accommodate TSVs, which wastes more area.) In addition, fabricating TSVs usually entails additional processing operations, which also increases the chip cost.

Hence, what is needed is a chip package that offers the advantages of stacked chips without the problems described above.

SUMMARY

One embodiment of the present disclosure provides a chip package that includes a set of semiconductor dies arranged in a stack in a vertical direction, which is substantially perpendicular to a plane of a first semiconductor die in the stack. In this stack, a given semiconductor die, after the first semiconductor die, is offset in a horizontal direction in the plane by an offset value from an immediately preceding semiconductor die in the stack, thereby defining a stepped terrace at one side of the stack. Moreover, surfaces of each of the semiconductor dies in the stepped terrace include two rows of first pads approximately parallel to edges of the semiconductor dies. Furthermore, the chip package includes connectors that are electrically and mechanically coupled to the first pads, and a ramp component, which is electrically and mechanically coupled to the semiconductor dies. This ramp component is positioned on the one side of the stack, and is approximately parallel to a direction along the stepped terrace, which is between the horizontal direction and the vertical direction. Additionally, the ramp component has a surface that includes second pads arranged in at least two rows of second pads for each of the semiconductor dies, and the connectors are electrically and mechanically coupled to the second pads.

Note that the ramp component may be a passive component, such as a plastic substrate with metal traces to electrically couple to the semiconductor dies. Alternatively, the ramp component may be another semiconductor die.

Furthermore, the connectors may include solder balls, and the connectors may be rigidly mechanically coupled to the first pads and the second pads. For example, the solder balls may have two different sizes, and a first size of the solder balls may be associated with a first row in the two rows of first pads and a second size of the solder balls may be associated with a second row in the two rows of first pads. Alternatively or additionally, the first pads may have two different sizes; a first size of the first pads may be associated with a first row in the two rows of first pads, and a second size of the first pads may be associated with a second row in the two rows of first pads. Similarly, the second pads may have two different sizes; a second size of the second pads may be associated with a first row in at least the two rows of second pads, and a second size of the second pads may be associated with a second row in at least the two rows of second pads. In some embodiments, at least some of the first pads and the second pads have an elliptical shape and/or at least some of the solder balls are compressed more than a remainder of the solder balls.

In some embodiments, the ramp component is electrically coupled to each of the semiconductor dies by flexible connectors (such as microspring connectors), and the connectors may be remateably mechanically coupled to the first pads and the second pads. For example, the flexible connectors may have two different heights, where a first height of the flexible connectors may be associated with a first row in the two rows of first pads and a second height of the flexible connectors may be associated with a second row in the two rows of first pads. Alternatively, the ramp component may be electrically coupled to each of the semiconductor dies by an anisotropic film.

To facilitate electrical coupling between the semiconductor dies and the ramp component, the ramp component may include pillars disposed on the surface and arranged in rows, where at least one of two rows of second pads for each of the semiconductor dies is disposed on one of the rows of pillars.

In some embodiments, surfaces of the semiconductor dies include negative features (such as etch pits) disposed on the surface and arranged in rows, where at least one of two rows of second pads for each of the semiconductor dies is disposed in one of the rows of negative features. Furthermore, positive features (such as balls, which may be the connectors) in the negative features may maintain relative alignment of the semiconductor dies in the stack.

Note that the ramp component may facilitate communication of electrical signals and power signals to the semiconductor dies without through-chip vias in the semiconductor dies.

In some embodiments, the chip package includes an intermediate chip between at least two of the semiconductor dies in the stack. This intermediate chip may transport heat generated by operation of at least the two of the semiconductor dies along the horizontal direction.

Another embodiment provides a computer system that includes the chip package.

Another embodiment provides an electronic device that includes the chip package.

Figure 1:
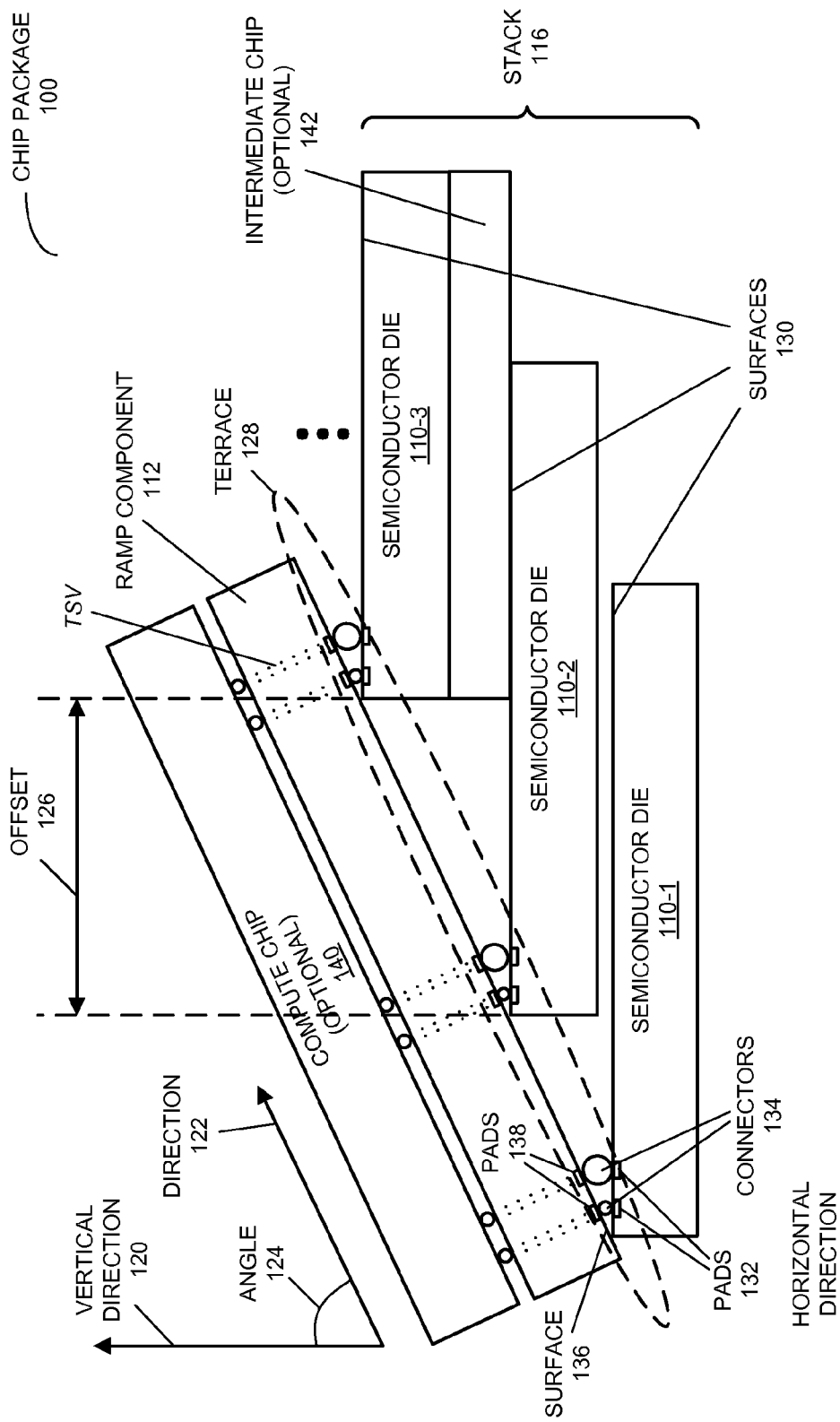
FIG. 1 is a block diagram illustrating a side view of a chip package in accordance with an embodiment of the present disclosure.

Table 1 provides examples of geometric parameters in a chip package in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of a chip package, an electronic device that includes the chip package, and a computer system that includes the chip package are described. This chip package includes a stack of semiconductor dies or chips that are offset from each other, thereby defining a terrace with exposed pads. Moreover, surfaces of each of the semiconductor dies in the stepped terrace include two rows of first pads approximately parallel to edges of the semiconductor dies. Furthermore, the chip package includes a high-bandwidth ramp component, which is positioned approximately parallel to the terrace, and which has a surface that includes second pads arranged in at least two rows of second pads for each of the semiconductor dies. The second pads are electrically and mechanically coupled to the exposed first pads by connectors. For example, the connectors may include: solder, flexible connectors and/or an anisotropic film. Consequently, the electrical contacts in the chip package may have a conductive, a capacitive or, in general, a complex impedance. Furthermore, the chips and/or the ramp component may be positioned relative to each other using a ball-and-pit alignment technique.

By removing the need for costly and area-consuming through-silicon vias (TSVs) in the semiconductor dies, the chip package may facilitate chips to be stacked in a manner that provides high bandwidth and low cost. For example, the cost may be reduced by avoiding the processing operations and the wasted area associated with TSVs in the semiconductor dies. Thus, the chips in the stack may be fabricated using standard processing. Furthermore, flexible connectors and/or an anisotropic film may have a lower cost and/or may offer improved reliability than wire bonding. Note that in embodiments where the mechanical and/or electrical coupling between the chips and the ramp component are remateable, the yield of the chip package may be increased by allowing rework (such as replacing a bad chip that is identified during assembly or burn-in).

In addition, the chip package can offer higher inter-component communication bandwidth than wire bonding. While TSVs in principle provide higher bandwidth, this typically requires a large number of TSVs that consume a significant percentage of the silicon area in the semiconductor dies. For a moderate number of TSVs, which waste less silicon area, the ramp component can offer comparable inter-component communication bandwidth. Moreover, by including two rows of pads on the semiconductor dies and the ramp component, the chip package facilitates high bandwidth electrical coupling between non-parallel surfaces.

Figure 2:
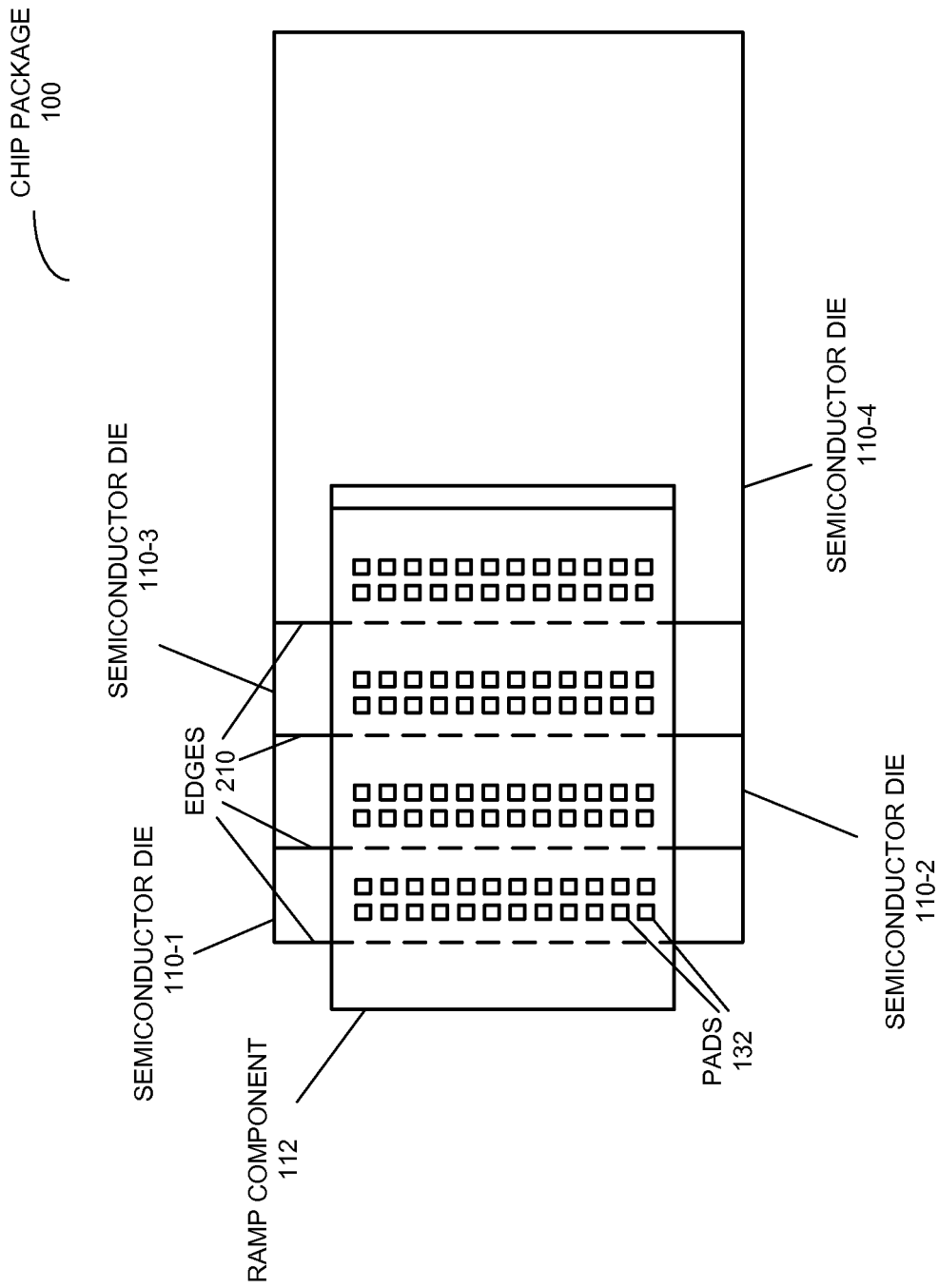
FIG. 2 is a block diagram illustrating a top view of a chip package in accordance with an embodiment of the present disclosure.

We now describe embodiments of a chip package. FIG. 1 presents a block diagram illustrating a side view of chip package 100 that includes a set of chips or semiconductor dies 110 arranged in a stack 116 along a vertical direction 120, which is substantially perpendicular to a plane that is parallel to semiconductor die 110-1. In this stack, each semiconductor die after semiconductor die 110-1 (such as semiconductor die 110-2) may be offset in a horizontal direction 118 in the plane by at least a minimum offset value 126 from an immediately preceding semiconductor die in stack 116, thereby defining a stepped terrace 128 at one side of stack 116 (having a constant angle 124). Moreover, surfaces 130 of each of semiconductor dies 110 in stepped terrace 128 include two rows of pads 132. As shown in FIG. 2, which presents a block diagram illustrating a top view of chip package 100, pads 132 may be approximately parallel to edges 210 of semiconductor dies 110.

Referring back to FIG. 1, chip package 100 includes connectors 134 that are electrically and mechanically coupled to pads 132, and a ramp component 112, which is electrically and mechanically coupled to semiconductor dies 110. This ramp component is positioned on the one side of stack 116, and is approximately parallel to a direction 122 along stepped terrace 128, which is between horizontal direction 118 and vertical direction 120. Additionally, ramp component 112 has a surface 136 that includes pads 138 arranged in at least two rows of pads 138 for each of semiconductor dies 110, and connectors 134 are electrically and mechanically coupled to pads 138.

Thus, semiconductor dies 110 may communicate with each other, and with an external device(s) or system(s), via ramp component 112. Note that ramp component 112 may facilitate communication of electrical signals and power signals to semiconductor dies 110 without TSVs in semiconductor dies 110. Therefore, semiconductor dies 110 may be fabricated using standard silicon processing. Moreover, these semiconductor dies may provide silicon area that supports logic and/or memory functionality.

In general, semiconductor dies or chips are attached to one another or a substrate in a chip package for mechanical and electrical reasons. For example, a substrate may provide extra stiffness to a chip, which may make it easier to handle when the chip package is moved around (such as during soldering or board assembly). Furthermore, a chip is typically only useful as long as it can receive power and communicate with an external environment. In traditional flip-chip packaging, the top surface of the chip is mated to a substrate, thereby providing a full 2-D area in which power and input/output (I/O) signals can pass between the substrate and the chip. The configuration of chip package 100 changes this paradigm significantly by presenting only a single edge of each chip to the substrate (or ramp component 112). However, this configuration can significantly limit the I/O and power delivery to the chips. Thus, while traditional flip-chip packaging allows the I/O capacity to scale linearly with the area as the chip size is increased, the configuration in chip package 100 may only allow the I/O capacity to grow linearly with the chip edge length, thus exacerbating the problem of limited I/O when compared to the chip area.

Figure 3:
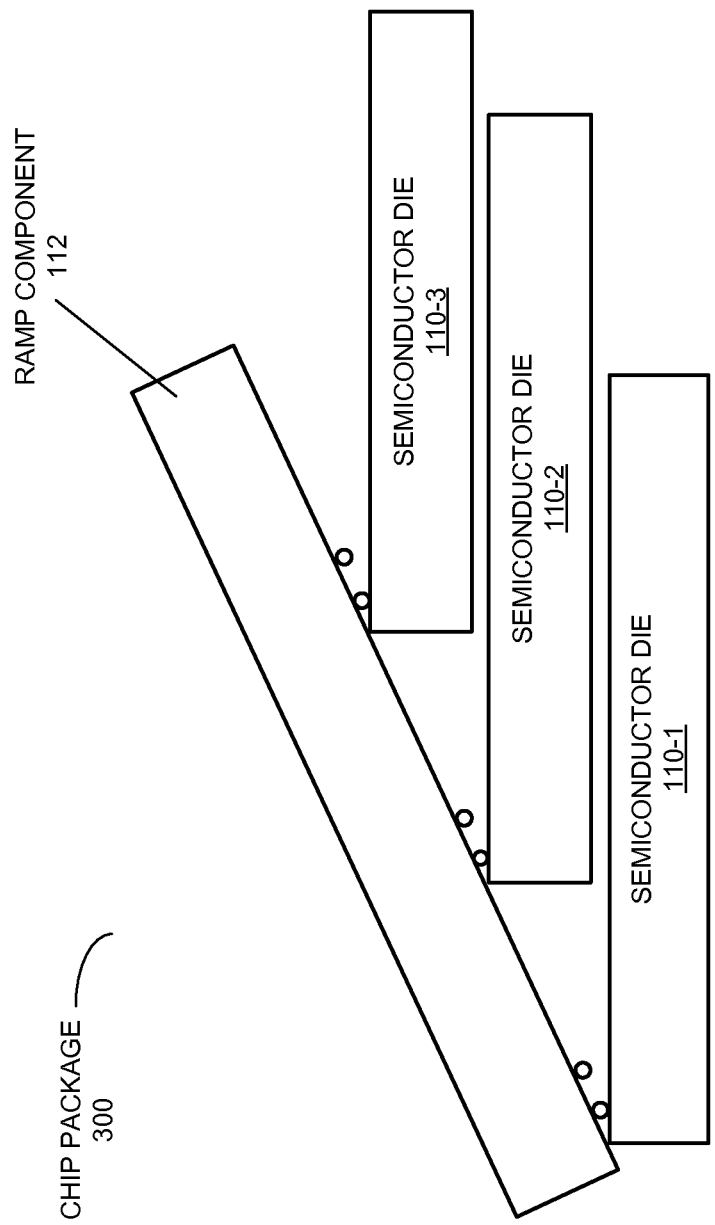
FIG. 3 is a block diagram illustrating a side view of a chip package with connector-geometry problems in accordance with an embodiment of the present disclosure.

To address this challenge, the number of connections between semiconductor dies 110 and ramp component 112 in chip package 100 is increased by adding second row of pads 132 and 138. However, this approach introduces another problem. In particular, because of the stacking geometry the distance or gap between surfaces 130 and 136 is not constant. As a consequence, it will be difficult to connect both rows of pads 132 and 138 using a single solder-ball size, which is often used in traditional flip-chip packaging. This connector-geometry problem is illustrated in FIG. 3, which presents a block diagram illustrating a side view of a chip package 300.

As shown in FIG. 1 and described further below, the connector-geometry problem may be addressed using at least two rows of pads or connectors on semiconductor dies 110 and ramp component 112. These additional pads potentially double the number of I/O connections. Because communication tends to be a limiting factor in modern systems, these extra I/O connections can significantly increase the performance of the chip package. For example, the additional pads can provide more power/ground connections, which can increase the lifetime of chip package 100 by reducing the current through the pads and, thus, reducing aging. Alternatively, the additional power/ground connections can enable the use of higher power components that have larger current and voltage requirements.

Furthermore, the extra I/O connections may enable increased bandwidth for communication and/or additional communication channels. For example, using chip package 100 the bandwidth available from so many DRAM chips can be accessed and made available to an optional compute chip 140 on an opposite side of ramp component 112 from semiconductor dies 110. This compute chip may be electrically coupled to semiconductor dies 110 by through-substrate vias (TSVs) (which are indicated by the dashed lines in ramp component 112), which may facilitate communication of electrical or power signals with semiconductor dies 110. Moreover, optional substrate 140 may include: a buffer or logic chip for memory, and/or I/O to external device(s) and/or system(s).

In an exemplary embodiment, each of semiconductor dies 110 in stack 116 may be an x8-DDR3 DRAM component. These memory devices may each have 92 I/O pins, of which 51 may be for power and ground, and the remaining 41 may be for signals. The semiconductor dies may have dimensions of 8.3×7.0 mm$^2$ with the I/O pads arranged along the short dimension. This means that, if all the I/O pads were placed in a single row along the short edge of a DRAM component, there would be only 76 µm per I/O pad. This distance includes the pad itself and the spacing between pads that is necessary to ensure that solder doesn't bridge between pads and short signals together. With current technology, this is a very aggressive pitch. Traditional flip-chip solder technology is currently around a 150-µm pitch. By using two rows of pads, the spacing between pads can be increased so that flip-chip packaging solder-ball technology (including traditional solder-ball sizes and spacings) can be used, thereby reducing the risk of poor connections because of aggressive scaling.

While FIG. 1 illustrates a particular configuration of chip package 100, a number of techniques and configurations may be used to implement electrical contact, mechanical alignment, assembly, and/or electrical I/O between ramp component 112 and semiconductor dies 110. In particular, a variety of techniques may be used to address the connector-geometry problem, for example, by changing the size of the solder balls to account for the variable gap between surfaces 130 and 136 so that connections can be established between components. The resulting connections may also be tolerant of faults that can occur when solder balls are compressed during reflow. We now describe several of these embodiments.

As described previously, in one technique connectors 134 may include solder balls (such as a reflowable solder layer), and connectors 134 may be rigidly mechanically coupled to pads 132 and 138. In particular, the connections may be designed so that bridging between some connections does not occur, thereby eliminating one of the causes of faults in a chip package. In general, when two surfaces are joined, the row of connectors associated with a smaller gap will be compressed, which may cause the solder balls to expand outward. If pads 132 and 138 are grouped such that the pads that carry the same signal are near each other, and the pads that carry disparate signals are further apart, then it is less likely that there will be unintended bridging between the pads associated with different signals. Note that pads that are allowed to bridge include power pad to power pad and ground pad to ground pad.

Figure 4:
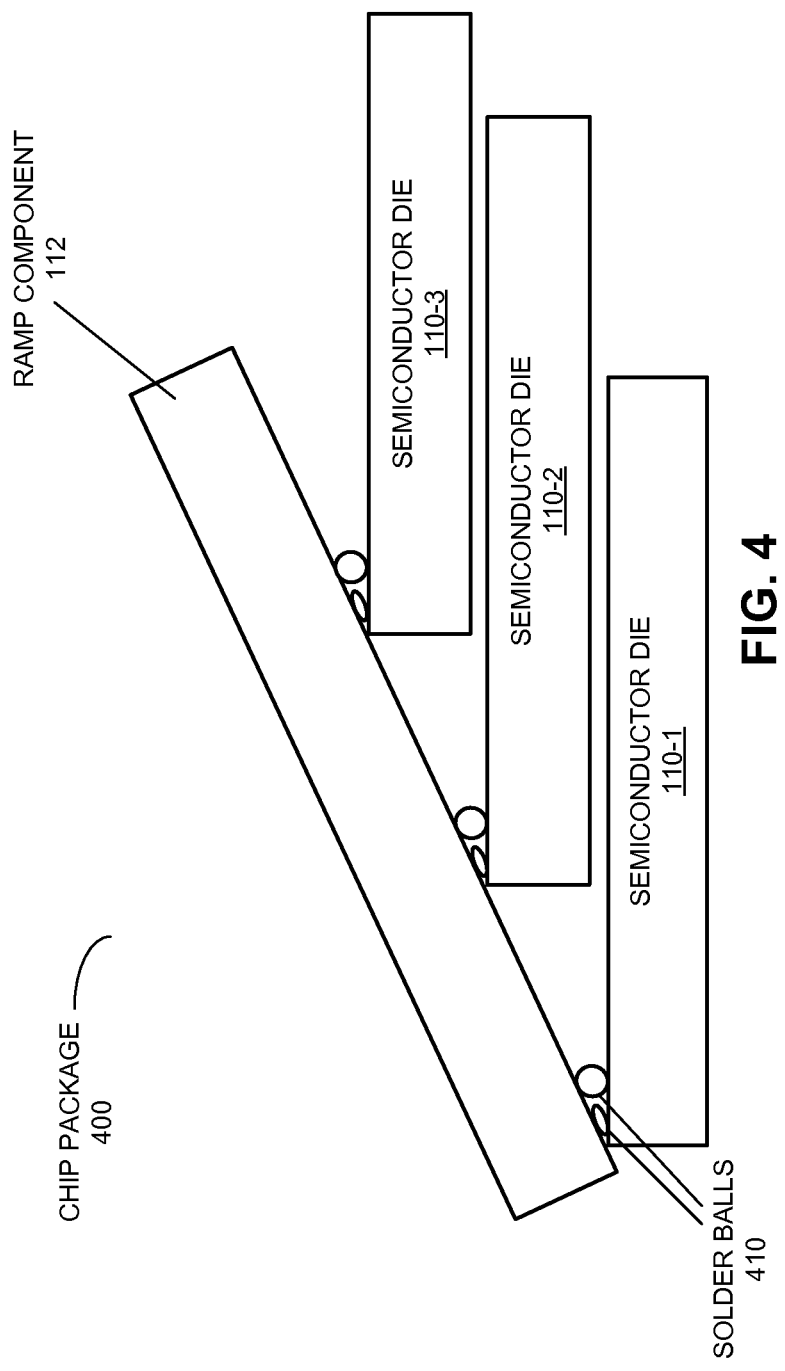
FIG. 4 is a block diagram illustrating a side view of a chip package with compressed-solder balls in accordance with an embodiment of the present disclosure.

A block diagram with a side view of a chip package 400 with compressed-solder balls 410 is shown in FIG. 4. In this chip package, at least some of the solder balls 410 are compressed more than a remainder of the solder balls. Note that compression of solder balls 410 may be modeled using analysis software called 'Surface Evolver' from Susquehanna University. This analysis software can simulate the physics of liquids under the forces of surface tension and gravity to determine the shape the liquid will take. In the case of compressed solder balls, the simulation shows that excess solder squirts out to the side of a compressed solder ball where the compression is the least. This is because the reduced curvature on this side has lower energy than the high curvature on the compressed side. As a consequence, solder balls in chip package 400 may be less likely to bridge within a row of pads, and may be more likely to bridge between different rows pads. Note that increasing the separation of the solder balls further (for example, by using a wider row to row spacing ls) may result in a larger variation in space occupied by each solder ball, and may result in more compression of the compressed solder ball in order to ensure that the solder balls in the second row will wet the pads on both surfaces 130 and 136 (FIG. 1).

In some embodiments, at least some of pads 132 and 138 (FIG. 1) have an elliptical shape. Usually, solder pads are round or approximately round. In chip package 400, solder pads with a higher aspect ratio may be useful because they allow expansion in the direction perpendicular to a row of pads where there is extra space. This may provide some margin to ensure good, low-impedance connections. Note that the aspect ratio may not be too high because solder balls 410 tend to be spherical in shape and may pull away from the ends of the solder pads.

Figure 5A:
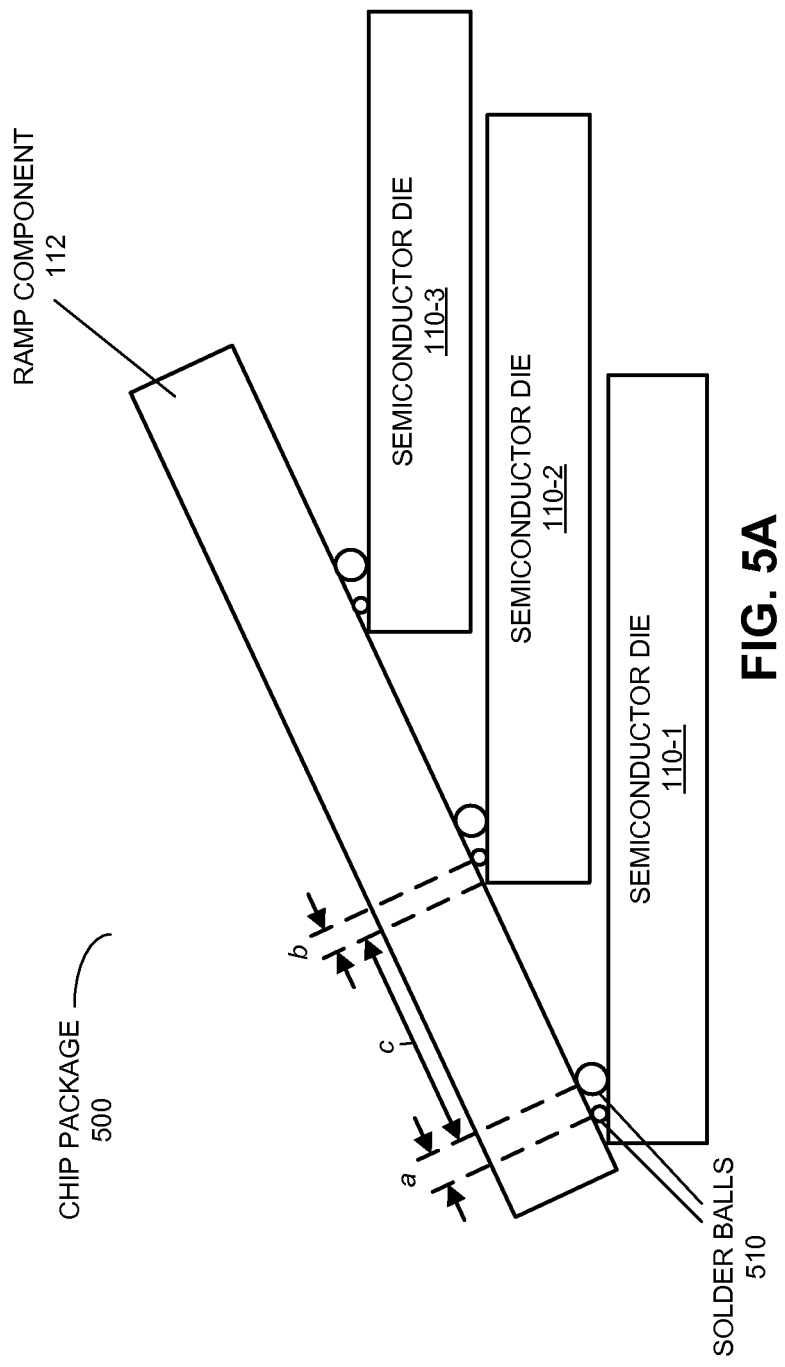
FIG. 5A is a block diagram illustrating a side view of a chip package with different sized solder balls in accordance with an embodiment of the present disclosure.

In another technique, different sized solder balls may be used for connectors 134 (FIG. 1) in the different rows. This is shown in FIG. 5A, which presents a block diagram illustrating a side view of a chip package 500 with different sizes of solder balls 510. This approach adjusts for the different gap between the rows by varying the size of solder balls 510 used to join each row. In particular, the first row of pads may use smaller solder balls while the second row of pads may use larger solder balls.

In order to increase the density, the pitch of the pads may also vary so that there are more connections in the row of pads with the smaller solder balls and fewer connections in the row of pads with the larger solder balls. This is shown in FIGS. 5B and 5C, which present block diagrams illustrating top views of chip packages 550 and 560 respectively with different pad pitches 570 and 572.

In chip packages 550 and 560, the solder balls may have two different sizes, with a first size of the solder balls associated with a first row of pads and a second size of the solder balls associated with a second row of pads. Alternatively or additionally, the pads may have two different sizes, with a first size of the pads associated with a first row of pads and a second size of the pads associated with a second row of pads. Note that these different pad sizes may be on either or both of surfaces 130 and 136 (FIG. 1).

Figure 5B:
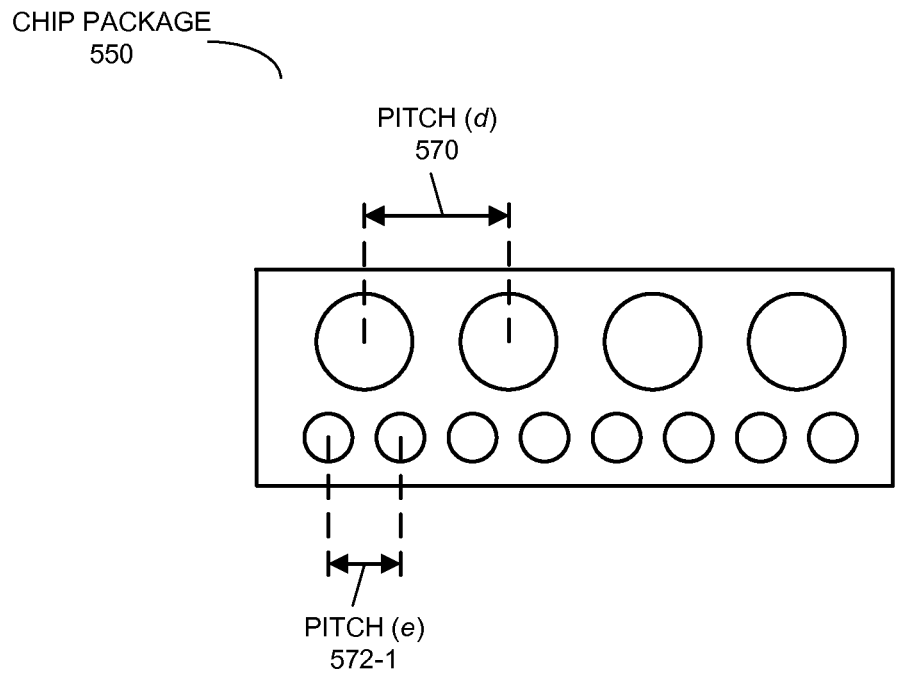
FIG. 5B is a block diagram illustrating a top view of a chip package with different pad pitches in accordance with an embodiment of the present disclosure.
Figure 5C:
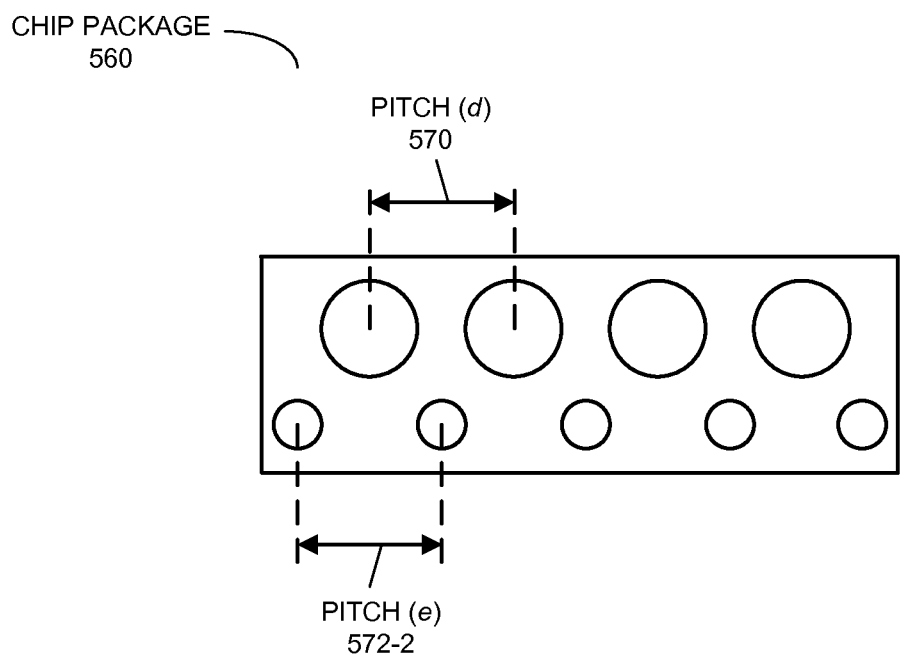
FIG. 5C is a block diagram illustrating a top view of a chip package with different pad pitches in accordance with an embodiment of the present disclosure.

As shown in FIGS. 5B and 5C, there are two choices in the solder placement. In chip package 550 in FIG. 5B, the highest density is used by using a smaller pitch for the small solder balls and a larger pitch for the larger solder balls. This approach may ensure that there is sufficient spacing for reliable solder connections and that the largest number of connections is achieved. In contrast, in chip package 560 in FIG. 5C the solder balls in both rows may have the same pitch. This approach may allow a tighter spacing between the two rows of pads but may reduce the density of connections. Note that routing the signals to the outer row of pads may be difficult in the layout shown in FIG. 5B. As a consequence, the layout shown in FIG. 5C may be preferable.

Exemplary embodiments of geometric parameters in FIGS. 4, 5B and 5C are shown in Table 1.

TABLE 1

| Geometric Parameter | Nominal Value (μm) | Range (μm) |
| --- | --- | --- |
| a | 132.5 | 75-200 |
| b | 135 | 75-200 |
| c | 120 | 65-180 |
| d | 100 | 60-150 |
| e | 170 | 90-250 |
| Chip thickness | 90 | 50-150 |
| Gap between chips | 10 | 8-15 |

A variety of techniques may be used to obtain different sizes of solder balls in a single chip package without bridging. For example, a laser-based solder placement tool (or a pick-and-place machine) may be used to place individual solder balls onto pads and then to wet them. This approach can place a wide variety of sizes of solder balls and can be used to place two different sizes on a single chip package. However, it may be difficult to scale a laser-based solder placement tool to rates faster than 8 balls per second.

Alternatively, different sizes of solder balls may be grown, respectively, on the surfaces of different chips that will be stacked in a chip package. This approach may use different chips to grow two different sizes of solder ball without conflicts. However, there may be more stringent handling requirements for the chips after they have been bumped, so this approach may require more careful handling to ensure good yields.

In another approach, two different sizes of solder balls may be grown on the same surface using different sized base pads/passivation openings. In particular, when solder paste is applied, it usually has a constant height across a chip. As a consequence, the volume of a solder ball is typically determined by the different radii of the pads. Then, when the solder is melted and reflowed, surface tension pulls the solder paste into a solder ball with a height determined primarily by the pad size and the volume of solder. However, in some embodiments different amounts of solder paste may be used to obtain different solder-ball sizes.

Figure 6:
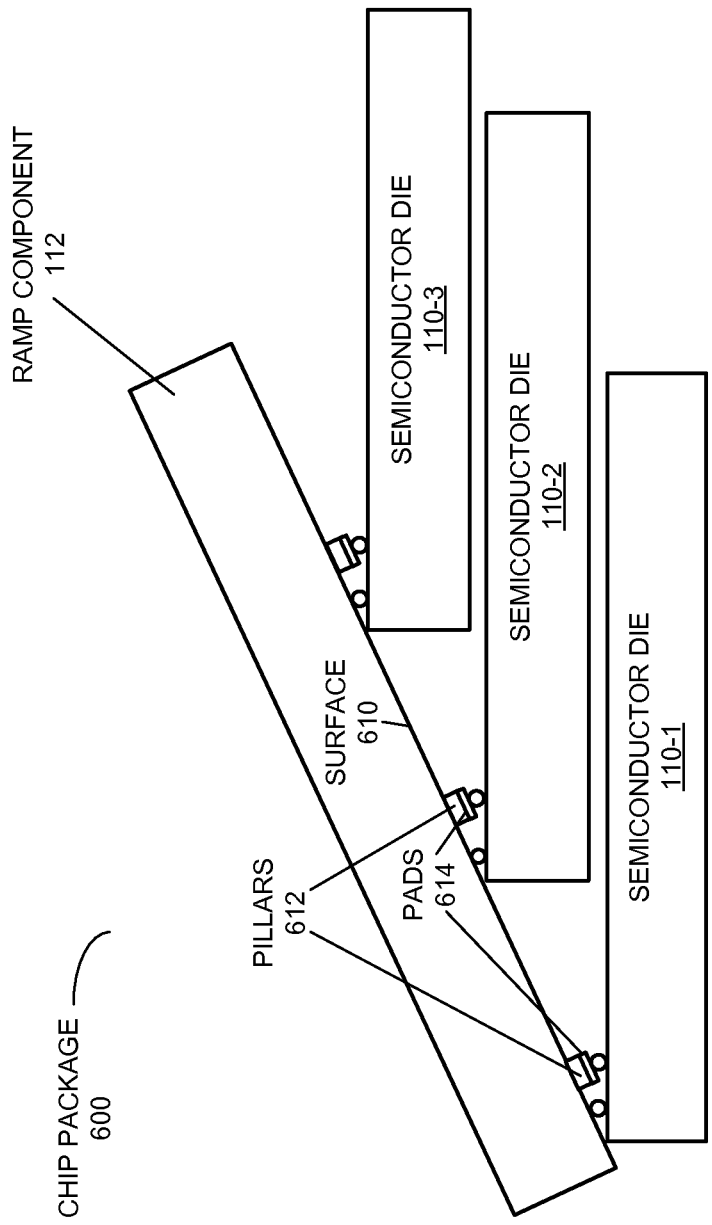
FIG. 6 is a block diagram illustrating a side view of a chip package with pads selectively raised above a surface in accordance with an embodiment of the present disclosure.

In some embodiments, the variable gap between the surfaces of semiconductor dies 110 (FIG. 1) are evened out by selectively adding to one surface. This is shown in FIG. 6, which presents a block diagram illustrating a side view of a chip package 600 with pads 614 selectively raised above a surface 610. For example, a row of copper pillars 612 with some solder may be used in one of the rows of pads to reduce the distance between the two surfaces. Then, solder balls may be placed on the row of pads on the other (opposing) surface, and when the chips are brought together for reflow, all the solder balls may have approximately the same distance to their target solder point. This approach leverages the maturity of copper-pillar solder bumping. In addition, copper pillars are conductive to both electricity and heat, so they may not require extra design on either chip, and the solder balls can be wetted to the pillars directly using standard processing.

Figure 7:
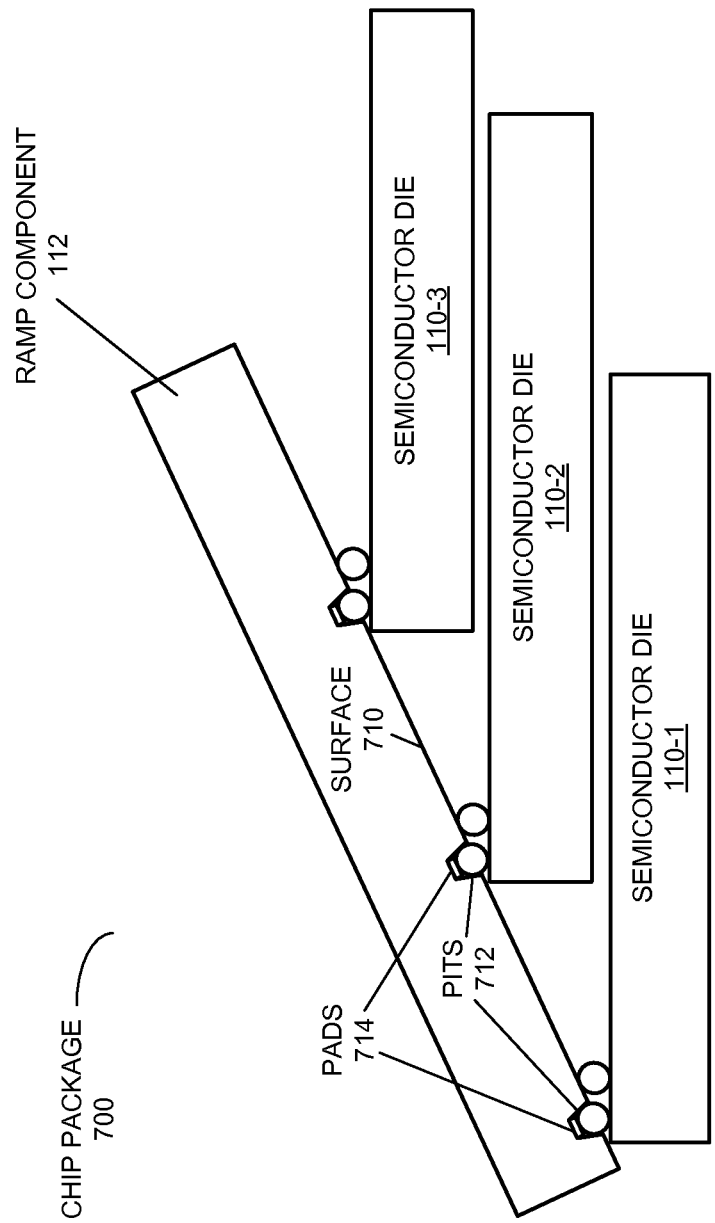
FIG. 7 is a block diagram illustrating a side view of a chip package with pads selectively lowered below a surface in accordance with an embodiment of the present disclosure.

Alternatively, the distance or gap between the chips may be evened out by selectively lowering some of the pads below a surface. This is shown in FIG. 7, which presents a block diagram illustrating a side view of a chip package 700 with pads 714 selectively lowered below a surface 710. For example, pits 712 (and, more generally, negative features) can be etched in surface 710 to lower an entire row of pads. This will increase the distance between the chip surfaces along this row of pads, keeping the distance or gap between the chips approximately the same for both rows of pads. This approach may also facilitate self-alignment of the connectors, because the solder balls (and, more generally, positive features) may naturally settle into the pits, thereby maintaining relative alignment of semiconductor dies 110 in stack 116 (FIG. 1). However, it may be difficult to provide a surface to attach the solder to which is electrically connected to the chip. Because the etching process requires that no metal be in the pit, an RDL process may be needed to add a metal pad inside the pit after the etching. This RDL pad may be electrically coupled to a pad on the surface of the chip outside the pit area.

Figure 8:
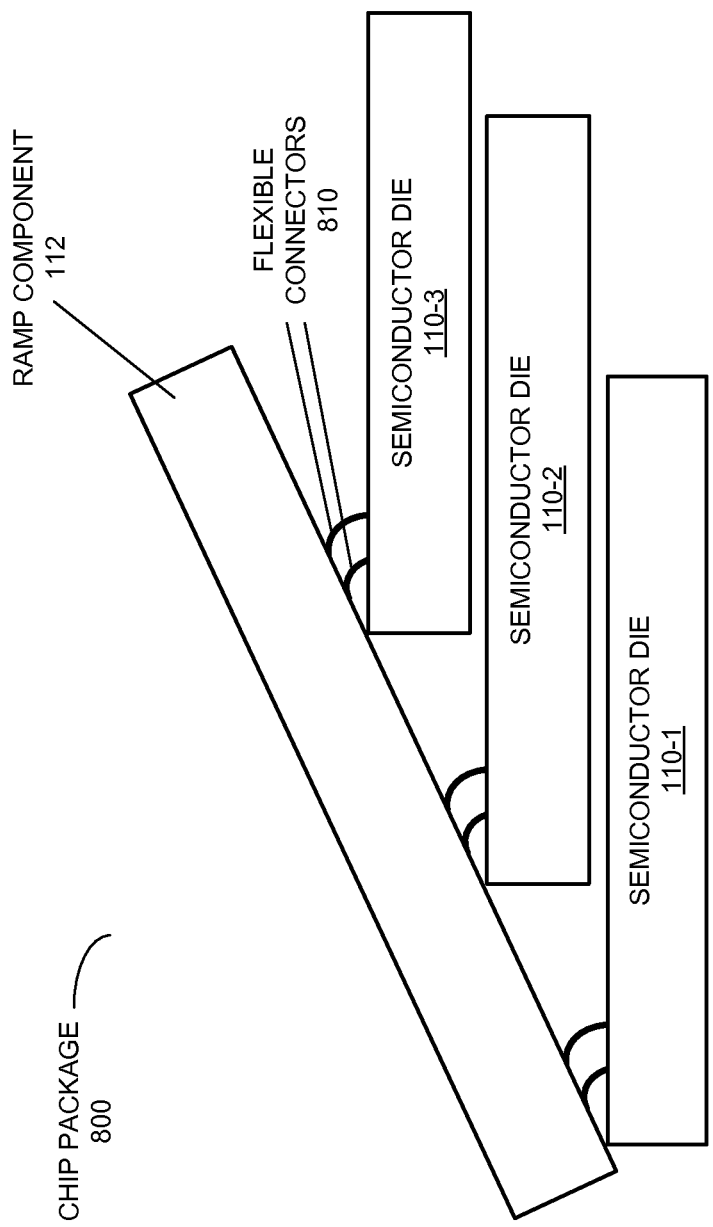
FIG. 8 is a block diagram illustrating a side view of a chip package with flexible connectors in accordance with an embodiment of the present disclosure.

In FIG. 1, ramp component 112 may be electrically coupled to each of semiconductor dies 110 by flexible connectors (such as microspring connectors), and connectors 134 may be remateably mechanically coupled to the pads 132 and 138. This is shown in FIG. 8, which presents a block diagram illustrating a side view of a chip package 800 with flexible connectors 810. For example, flexible connectors 810 may have two different heights, with a first height of flexible connectors 810 associated with a first row of the pads and a second height of flexible connectors 810 associated with a second row of the pads.

Note that flexible connectors 810 can be fabricated on a wide variety of surfaces, including: a printed circuit board (PCB), an organic or ceramic integrated circuit (IC), and/or on the surface of a semiconductor die. Moreover, flexible connectors 810 can be fabricated with an areal density of inter-chip connections that exceeds the density of I/O signals on high performance ICs, and the compliance of flexible connectors 810 can increase the tolerance to mechanical movement and misalignment of components in chip package 800.

Flexible connectors 810 can also provide mechanical and electrical contacts without the use of solder. Thus, the mechanical and/or the electrical coupling between ramp component 112 and semiconductor dies 110 in FIG. 1 can be removable or remateable (i.e., these components can be remateably coupled), which facilitates rework of chip package 800 during and/or after assembly and test. Note that remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components that are designed to couple to each other (such as components that snap together). Thus, remateable components are components that are configured to allow remateable coupling to be established. However, as described previously, in some embodiments the mechanical and/or the electrical coupling between ramp component 112 and semiconductor dies 110 in FIG. 1 is more permanent (for example, it may not be remateable, such as solder contacts).

In order to increase the capacitance of the connections, in some embodiments a conductive liquid, paste or film may be added to the contact area to fill in any gaps. This would also have the beneficial effect of increasing the area of overlap to the extent that the liquid, paste or film extends beyond the edges of the given flexible connectors.

Alternatively, in FIG. 1 ramp component 112 may be electrically coupled to each of semiconductor dies 110 by an anisotropic film (not shown), such as an anisotropic elastomer film (which is sometimes referred to as an 'anisotropic conductive film'). Note that the anisotropic properties of an anisotropic film enhance electrical conductivity normal to the surface of the anisotropic film while also diminishing electrical conductivity tangential to the surface of the anisotropic film. As a result, the anisotropic film may electrically couple mechanically aligned pads on opposite faces of the anisotropic film.

For example, the anisotropic film may include the Pari-Poser® material (from Paricon Technologies, Inc., of Fall River, Mass.), as well as other types of anisotropic films, such as those based on conductive elastomers electrically coupling conductive foils that are separated by insulating sheets. In a PariPoser-type of anisotropic conductive elastomer film, small conductive balls are suspended in silicone rubber such that the balls generally line up into columns and provide conduction normal, but not tangential, to the surfaces of the anisotropic film. As with flexible connectors 810 (FIG. 8), in general the impedance of the resulting electrical contacts may be conductive and/or capacitive. If the impedance is conductive, conventional transmit and receive I/O circuits may be used in components in chip package 100. However, if the impedance is complex, the transmit and receive I/O circuits in chip package 100 may include one or more embodiments described in U.S. patent application Ser. No. 12/425,871, entitled "Receive Circuit for Connectors with Variable Complex Impedance," by Robert J. Drost et al., filed on Apr. 17, 2009, the contents of which are hereby incorporated by reference.

Figure 9:
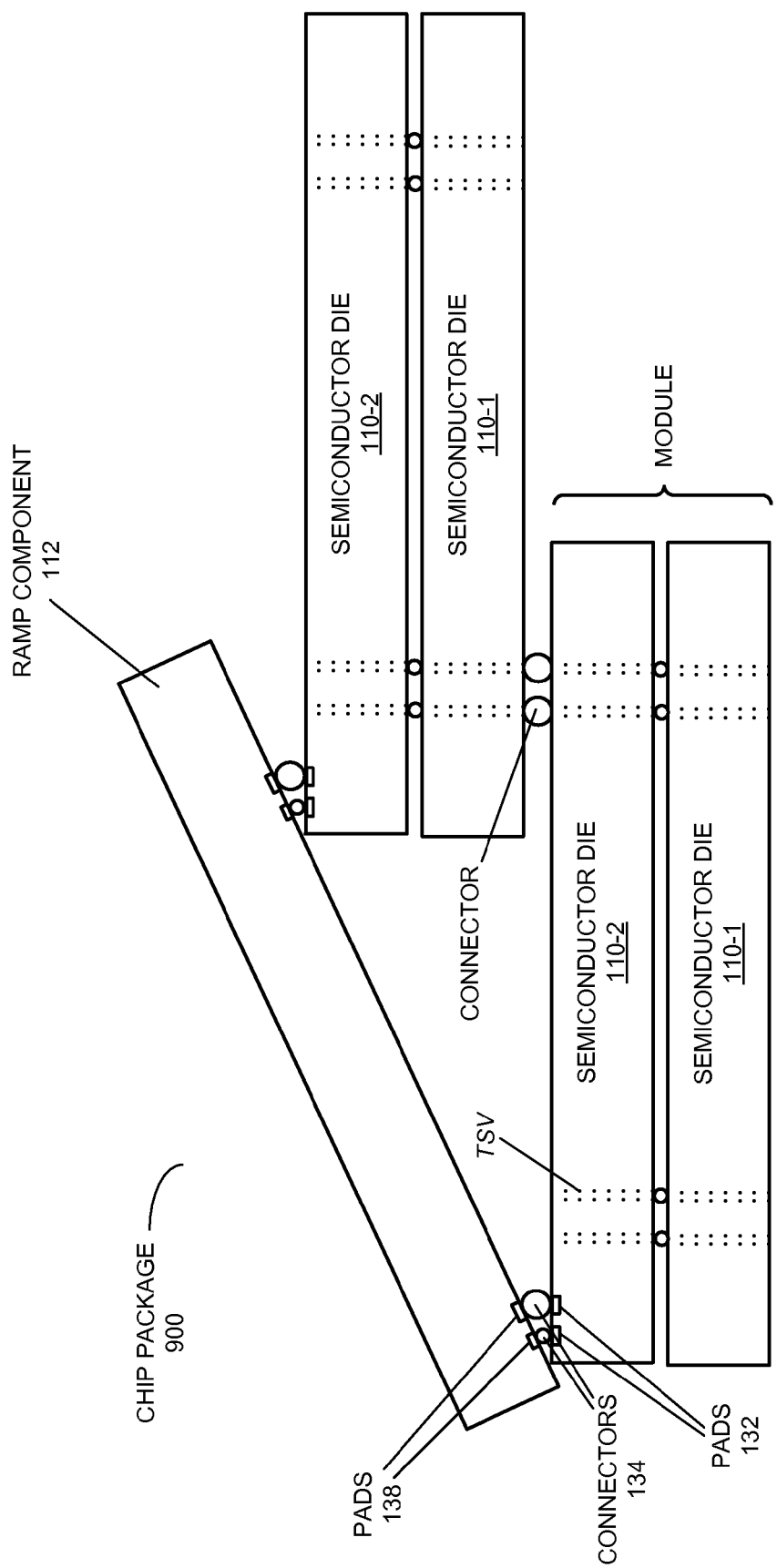
FIG. 9 is a block diagram illustrating a side view of a chip package in accordance with an embodiment of the present disclosure.

In some embodiments, semiconductor dies 110 in FIG. 1 are replaced by units or modules that each include two or more semiconductor dies that are coupled by TSVs. This is shown in FIG. 9, which presents a block diagram illustrating a side view of a chip package 900. This approach may allow a 40-chip stack to be composed of ten four-chip modules. As a consequence, the TSV assembly process may only have to handle four chips at a time, and the stacking process in chip package 900 may only have to handle ten modules at a time. Relative to a 40-chip stack, this may reduce the difficult in fabricating chip package 900. In addition, it may be easier to handle the TSV-based modules than individual semiconductor dies because the modules may be thicker (and, therefore, stiffer).

Figure 10:
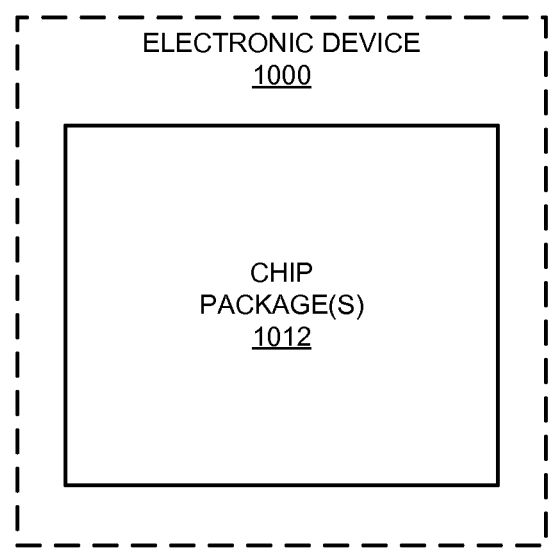
FIG. 10 is a block diagram illustrating an electronic device that includes one or more chip packages in accordance with an embodiment of the present disclosure.

We now describe embodiments of an electronic device and a computer system. FIG. 10 presents a block diagram illustrating an electronic device 1000 that includes one or more chip packages 1012, such as one of the previous embodiments of a chip package. Note that electronic device 1000 may include a power supply 1010 (such as a battery) that is electrically coupled to the one or more chip packages 1012.

Figure 11:
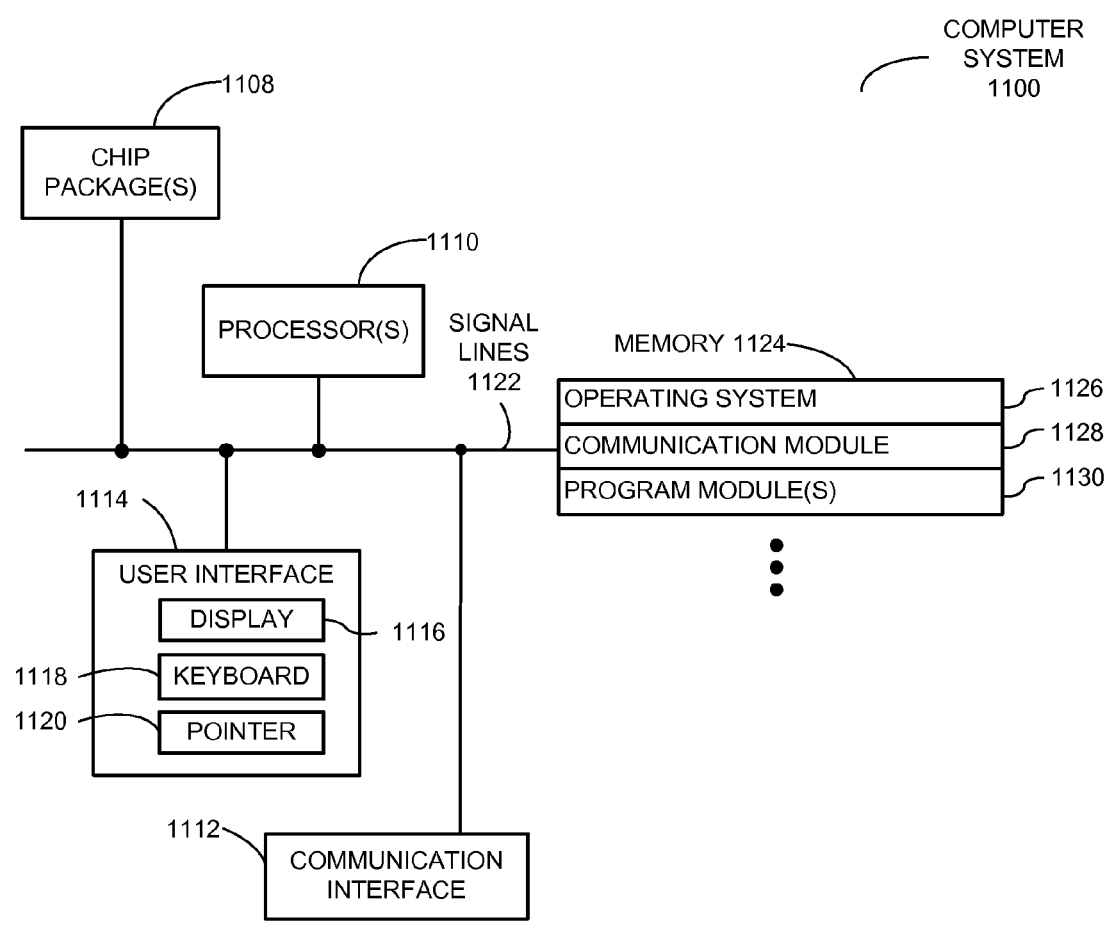
FIG. 11 is a block diagram illustrating a computer system that includes one or more chip packages in accordance with an embodiment of the present disclosure.

FIG. 11 presents a block diagram illustrating a computer system 1100 that includes one or more chip packages 1108, such as one of the previous embodiments of a chip package. Computer system 1100 includes: one or more processors (or processor cores) 1110, a communication interface 1112, a user interface 1114, and one or more signal lines 1122 coupling these components together. Note that the one or more processors (or processor cores) 1110 may support parallel processing and/or multi-threaded operation, the communication interface 1112 may have a persistent communication connection, and the one or more signal lines 1122 may constitute a communication bus. Moreover, the user interface 1114 may include: a display 1116, a keyboard 1118, and/or a pointer 1120, such as a mouse.

Memory 1124 in the computer system 1100 may include volatile memory and/or non-volatile memory. More specifically, memory 1124 may include: ROM, RAM, EPROM, EEPROM, flash, one or more smart cards, one or more magnetic disc storage devices, and/or one or more optical storage devices. Memory 1124 may store an operating system 1126 that includes procedures (or a set of instructions) for handling various basic system services for performing hardware-dependent tasks. Moreover, memory 1124 may also store communications procedures (or a set of instructions) in a communication module 1128. These communication procedures may be used for communicating with one or more computers, devices and/or servers, including computers, devices and/or servers that are remotely located with respect to the computer system 1100.

Memory 1124 may also include one or more program modules 1130 (or a set of instructions). Note that one or more of program modules 1130 may constitute a computer-program mechanism. Instructions in the various modules in the memory 1124 may be implemented in: a high-level procedural language, an object-oriented programming language, and/or in an assembly or machine language. The programming language may be compiled or interpreted, i.e., configurable or configured, to be executed by the one or more processors (or processor cores) 1110.

Computer system 1100 may include, but is not limited to: a server, a laptop computer, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, and/or another electronic computing device. For example, chip package(s) 1108 may be included in a backplane that is coupled to multiple processor blades, or chip package(s) 1108 may couple different types of components (such as processors, memory, I/O devices, and/or peripheral devices). Thus, chip package(s) 1108 may perform the functions of: a switch, a hub, a bridge, and/or a router. Note that computer system 1100 may be at one location or may be distributed over multiple, geographically dispersed locations.

Note that some or all of the functionality of electronic device 1000 (FIG. 10) and/or computer system 1100 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

The preceding embodiments may include fewer components or additional components. Moreover, although these chip packages, devices and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

In some embodiments, in FIG. 1 chip package 100 includes features to remove heat generated during operation of circuits on one or more semiconductor dies 110 and/or ramp component 112. In particular, chip package 100 may include an optional intermediate chip 142 between at least two of semiconductor dies 110. This intermediate chip may transport heat generated by operation of at least the one of the semiconductor dies along horizontal direction 118. Furthermore, heat transport may be facilitated by micro-fluidics on optional intermediate chip 142. Note that in some embodiments, optional intermediate chip 142 can also reduce cross-talk between two or more semiconductor dies 110.

While the preceding embodiments use semiconductor dies 110 in FIG. 1 (such as silicon) in the chip packages, in other embodiments a different material than a semiconductor may be used as the substrate material in one or more of these chips. Therefore, in some embodiments ramp component 112 is a passive component, such as a plastic substrate with metal traces to electrically couple to semiconductor dies 110. For example, ramp component 112 may be fabricated using injection-molded plastic. Alternatively, ramp component 112 may be another semiconductor die with lithographically defined wires or signal lines. In embodiments where ramp component 112 includes a semiconductor die, active devices, such as limit amplifiers, may be included to reduce cross-talk between the signal lines. Additionally, cross-talk may be reduced in either an active or a passive ramp component 112 using differential signaling.

In some embodiments, ramp component 112 includes transistors and wires that shuttle data and power signals among semiconductor dies 110 via connectors 134. For example, ramp component 112 may include high-voltage signals. These signals may be stepped down for use on semiconductor dies 110 using: a step-down regulator (such as a capacitor-to-capacitor step-down regulator), as well as capacitor and/or inductor discrete components to couple to semiconductor dies 110.

Note that there may be optional encapsulation (not shown) around at least a portion of chip package 100.

In general, components in chip package 100 may communicate with each other and/or with external device(s) or system(s) using PxC of electromagnetically coupled signals (which is referred to as 'electromagnetic proximity communication'), such as capacitively coupled signals and/or proximity communication of optical signals (which are, respectively, referred to as 'electrical proximity communication' and 'optical proximity communication'). In some embodiments, the electromagnetic proximity communication includes inductively coupled signals and/or conductively coupled signals.

Therefore, the impedance associated with electrical contacts between connectors 134 and semiconductor dies 110 may be conductive (i.e., in-phase) and/or capacitive (i.e., out-of-phase), such as when there is a passivation layer (e.g., a glass layer) above metal pads on or proximate to surfaces of semiconductor dies 110. In general, the impedance may be complex, which includes an in-phase component and an out-of-phase component. Regardless of the electrical contact mechanism (such as solder, flexible connectors, and/or an anisotropic film), if the impedance associated with the contacts is conductive, conventional transmit and receive I/O circuits may be used in components in chip package 100. However, as noted previously, for contacts having a complex (and, possibly, variable) impedance, the transmit and receive I/O circuits may include one or more embodiments described in U.S. patent application Ser. No. 12/425,871.

As noted previously, a wide variety of alignment techniques may be used in the embodiments of the chip package. One alignment technique involves the use of etch pits in conjunction with balls in the etch pits to maintain relative alignment of semiconductor dies 110 in stack 116. More generally, any combination of mechanically locking positive and negative surface features on ramp component 112 and/or semiconductor dies 110 may align the components in the chip package.

Note that in some embodiments electronic alignment techniques are used to correct for planar mechanical misalignments in a chip package. For example, electronic alignment may be used with conductive and/or capacitive contacts if a given flexible-connector contacts an array of transmit or receive micropads or microbars.

In some embodiments, assembly of chip package 100 is facilitated using mechanical stops that help position semiconductor dies 110 in stack 116. In addition, electrical coupling via connectors 134 may be facilitated by compression elements disposed on either or both of surfaces 130 and 136, and which compress at least some of connectors 134.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
semiconductor dies arranged in a stack in a vertical direction, which is substantially perpendicular to a plane of a first semiconductor die in the stack, wherein each semiconductor die, after the first semiconductor die, is offset in a horizontal direction in the plane by an offset value from an immediately preceding semiconductor die in the stack, thereby defining a stepped terrace at one side of the stack, and wherein surfaces of each of the semiconductor dies in the stepped terrace include two rows of first pads approximately parallel to edges of the semiconductor dies;
connectors electrically and mechanically coupled to the first pads; and
a ramp component positioned on the one side of the stack, wherein the ramp component is approximately parallel to a direction along the stepped terrace, which is between the horizontal direction and the vertical direction;
wherein the ramp component has a surface that includes second pads arranged in at least two rows of second pads for each of the semiconductor dies; and
wherein the connectors are electrically and mechanically coupled to the second pads including at least two rows of connectors, wherein a first row of the connectors are coupled to a first row of the first pads and a first row of the second pads, wherein a second row of the connectors are coupled to a second row of the first pads and a second row of the second pads, and wherein the two rows of connectors have at least one of the following configurations: the two rows of connectors have different sizes, the two rows of connectors have different shapes, and at least one of the two rows of connectors have sub-components including pits or pillars, thereby enabling coupling of the first and second pads with variable spacing.

2. The chip package of claim 1, wherein the connectors include solder balls; and
wherein the connectors are rigidly mechanically coupled to the first pads and the second pads.

3. The chip package of claim 2, wherein the solder balls have two different sizes; and
wherein a first size of the solder balls is associated with a first row in the two rows of first pads and a second size of the solder balls is associated with a second row in the two rows of first pads.

4. The chip package of claim 2, wherein the first pads have two different sizes; and
wherein a first size of the first pads is associated with a first row in the two rows of first pads and a second size of the first pads is associated with a second row in the two rows of first pads.

5. The chip package of claim 2, wherein the second pads have two different sizes; and
wherein a second size of the second pads is associated with a first row in at least the two rows of second pads and a second size of the second pads is associated with a second row in at least the two rows of second pads.

6. The chip package of claim 2, wherein at least some of the first pads and the second pads have an elliptical shape.

7. The chip package of claim 2, wherein at least some of the solder balls are compressed more than a remainder of the solder balls.

8. The chip package of claim 1, wherein the connectors include flexible connectors; and
wherein the connectors are remateably mechanically coupled to the first pads and the second pads.

9. The chip package of claim 8, wherein the flexible connectors have two different heights; and
wherein a first height of the flexible connectors is associated with a first row in the two rows of first pads and a second height of the flexible connectors is associated with a second row in the two rows of first pads.

10. The chip package of claim 1, wherein the ramp component includes pillars disposed on the surface and arranged in rows; and
wherein at least one of two rows of second pads for each of the semiconductor dies is disposed on one of the rows of pillars.

11. The chip package of claim 1, wherein the ramp component includes negative features disposed on the surface and arranged in rows; and
wherein at least one of two rows of second pads for each of the semiconductor dies is disposed in one of the rows of negative features.

12. The chip package of claim 1, wherein the ramp component is a passive component.

13. The chip package of claim 12, wherein the passive component includes a plastic substrate with metal traces for electrically coupling to the semiconductor dies.

14. The chip package of claim 1, wherein the ramp component is another semiconductor die.

15. The chip package of claim 1, wherein the connector includes an anisotropic conductive film.

16. The chip package of claim 1, wherein the ramp component facilitates communication of electrical signals and power signals to the semiconductor dies without through-chip vias in the semiconductor dies.

17. The chip package of claim 1, further comprising an intermediate chip between at least two of the semiconductor dies in the stack, wherein the intermediate chip is configured to transport heat generated by operation of at least the two of the semiconductor dies along the horizontal direction.

18. The chip package of claim 1, wherein the surfaces of the semiconductor dies include negative features; and
wherein positive features in the negative features maintain relative alignment of the semiconductor dies in the stack.

19. A computer system, comprising:
a processor;
a memory storing a program module that is configured to be executed by the processor; and
a chip package, wherein the chip package includes:
  semiconductor dies arranged in a stack in a vertical direction which is substantially perpendicular to a plane of a first semiconductor die in the stack, wherein each semiconductor die, after the first semiconductor die, is offset in a horizontal direction in the plane by an offset value from an immediately preceding semiconductor die in the stack, thereby defining a stepped terrace at one side of the stack, and wherein surfaces of each of the semiconductor dies in the stepped terrace include two rows of first pads approximately parallel to edges of the semiconductor dies;
  connectors electrically and mechanically coupled to the first pads; and
  a ramp component positioned on the one side of the stack, wherein the ramp component is approximately parallel to a direction along the stepped terrace, which is between the horizontal direction and the vertical direction;
  wherein the ramp component has a surface that includes second pads arranged in at least two rows of second pads for each of the semiconductor dies; and
  wherein the connectors are electrically and mechanically coupled to the second pads including at least two rows of connectors, wherein a first row of the connectors are coupled to a first row of the first pads and a first row of the second pads, wherein a second row of the connectors are coupled to a second row of the first pads and a second row of the second pads, and wherein the two rows of connectors have at least one of the following configurations: the two rows of connectors have different sizes, the two rows of connectors have different shapes, and at least one of the two rows of connectors have sub-components including pits or pillars, thereby enabling coupling of the first and second pads with variable spacing.

* * * * *